(12) United States Patent
Tani et al.

(10) Patent No.: US 11,393,658 B2
(45) Date of Patent: Jul. 19, 2022

(54) CHARGED PARTICLE BEAM APPARATUS AND SAMPLE OBSERVATION METHOD

(71) Applicant: Hitachi High-Tech Corporation, Tokyo (JP)

(72) Inventors: Yuki Tani, Tokyo (JP); Kunji Shigeto, Tokyo (JP); Kenji Aoki, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 0 days.

(21) Appl. No.: 17/277,553

(22) PCT Filed: Nov. 13, 2018

(86) PCT No.: PCT/JP2018/041927
§ 371 (c)(1),
(2) Date: Mar. 18, 2021

(87) PCT Pub. No.: WO2020/100205
PCT Pub. Date: May 22, 2020

(65) Prior Publication Data
US 2022/0037112 A1 Feb. 3, 2022

(51) Int. Cl.
*H01J 37/28* (2006.01)
*H01J 37/244* (2006.01)
*H01J 37/26* (2006.01)

(52) U.S. Cl.
CPC .......... *H01J 37/28* (2013.01); *H01J 37/244* (2013.01); *H01J 37/265* (2013.01); *H01J 2237/24475* (2013.01)

(58) Field of Classification Search
CPC .. H01J 37/00; H01J 37/02; H01J 37/22; H01J 37/244; H01J 37/26; H01J 37/28; H01J 37/261; H01J 37/265; H01J 2237/24475
(Continued)

(56) References Cited

U.S. PATENT DOCUMENTS

| 4,990,776 A * | 2/1991 | Fushimi | G01R 31/305 250/397 |
| 2006/0138359 A1* | 6/2006 | Maeda | B82Y 10/00 250/492.23 |

FOREIGN PATENT DOCUMENTS

| JP | 59-197881 A | 11/1984 |
| JP | 2-155157 A | 6/1990 |

(Continued)

OTHER PUBLICATIONS

International Search Report (PCT/ISA/210) issued in PCT Application No. PCT/JP2018/041927 dated Dec. 25, 2018 with English translation (four (4) pages).
(Continued)

*Primary Examiner* — Jason L McCormack
(74) *Attorney, Agent, or Firm* — Crowell & Moring LLP

(57) ABSTRACT

The invention provides a charged particle beam apparatus capable of observing a sample even when light is emitted from the sample, and a sample observation method using the charged particle beam apparatus. The charged particle beam apparatus includes: a charged particle beam source configured to irradiate a sample with a charged particle beam; a detector configured to detect charged particles emitted from the sample; and a control device configured to generate an image based on an output signal from the detector. The charged particle beam apparatus further includes a filter configured to allow at least a part of the charged particles emitted from the sample to transmit through the filter and configured to shield light emitted from the sample. The filter covers a detection surface of the detector expected from the sample.

9 Claims, 7 Drawing Sheets

(58) Field of Classification Search
USPC .......................................... 250/306, 307, 311
See application file for complete search history.

(56) References Cited

FOREIGN PATENT DOCUMENTS

| | | |
|---|---|---|
| JP | 8-138610 A | 5/1996 |
| JP | 9-134696 A | 5/1997 |

OTHER PUBLICATIONS

Japanese-language Written Opinion (PCT/ISA/237) issued in PCT Application No. PCT/JP2018/041927 dated Dec. 25, 2018 (eight (8) pages).

* cited by examiner

[FIG. 1]
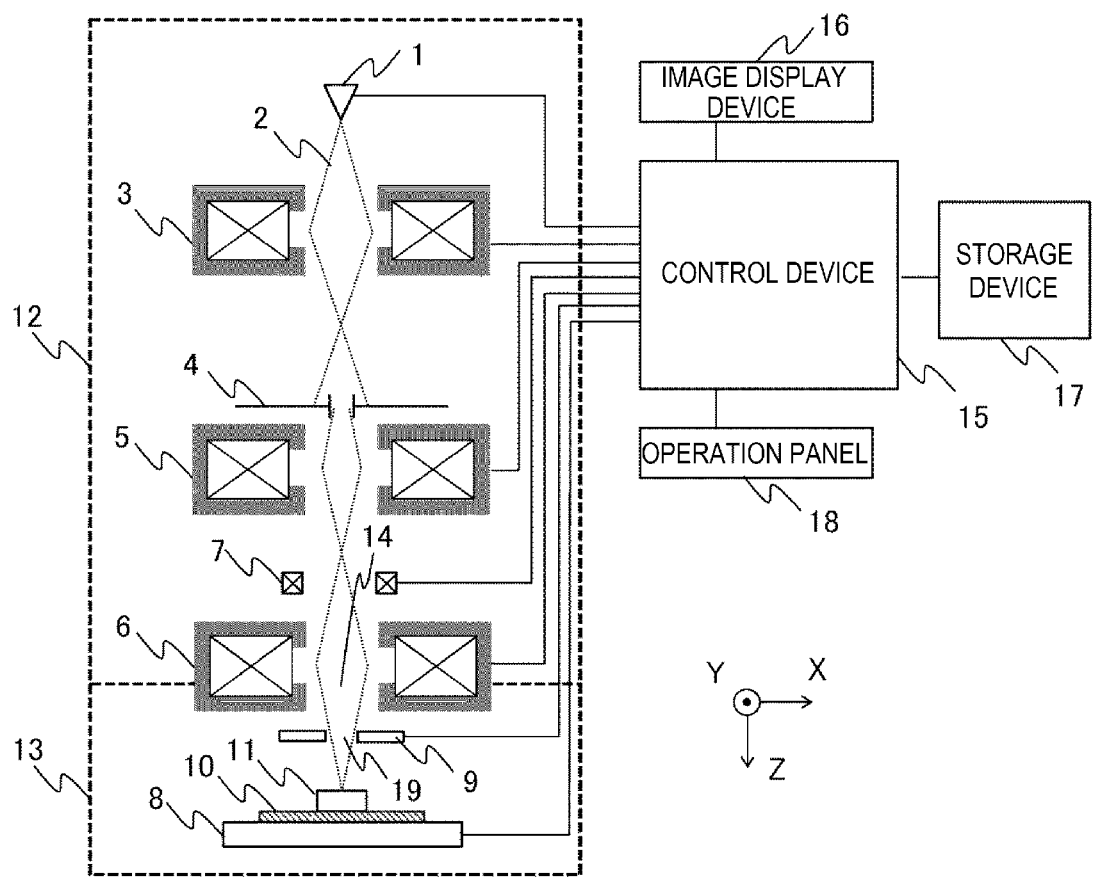

[FIG. 4]
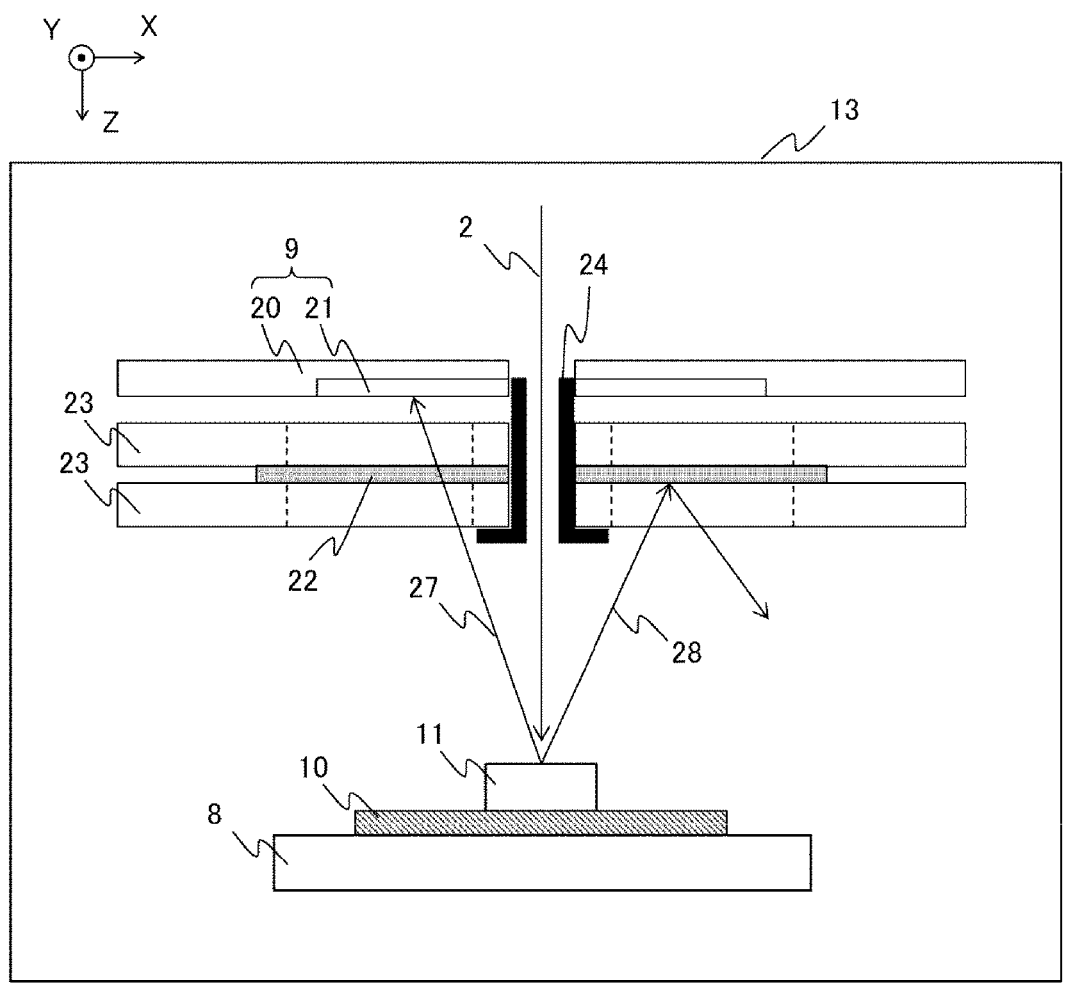

[FIG. 5]
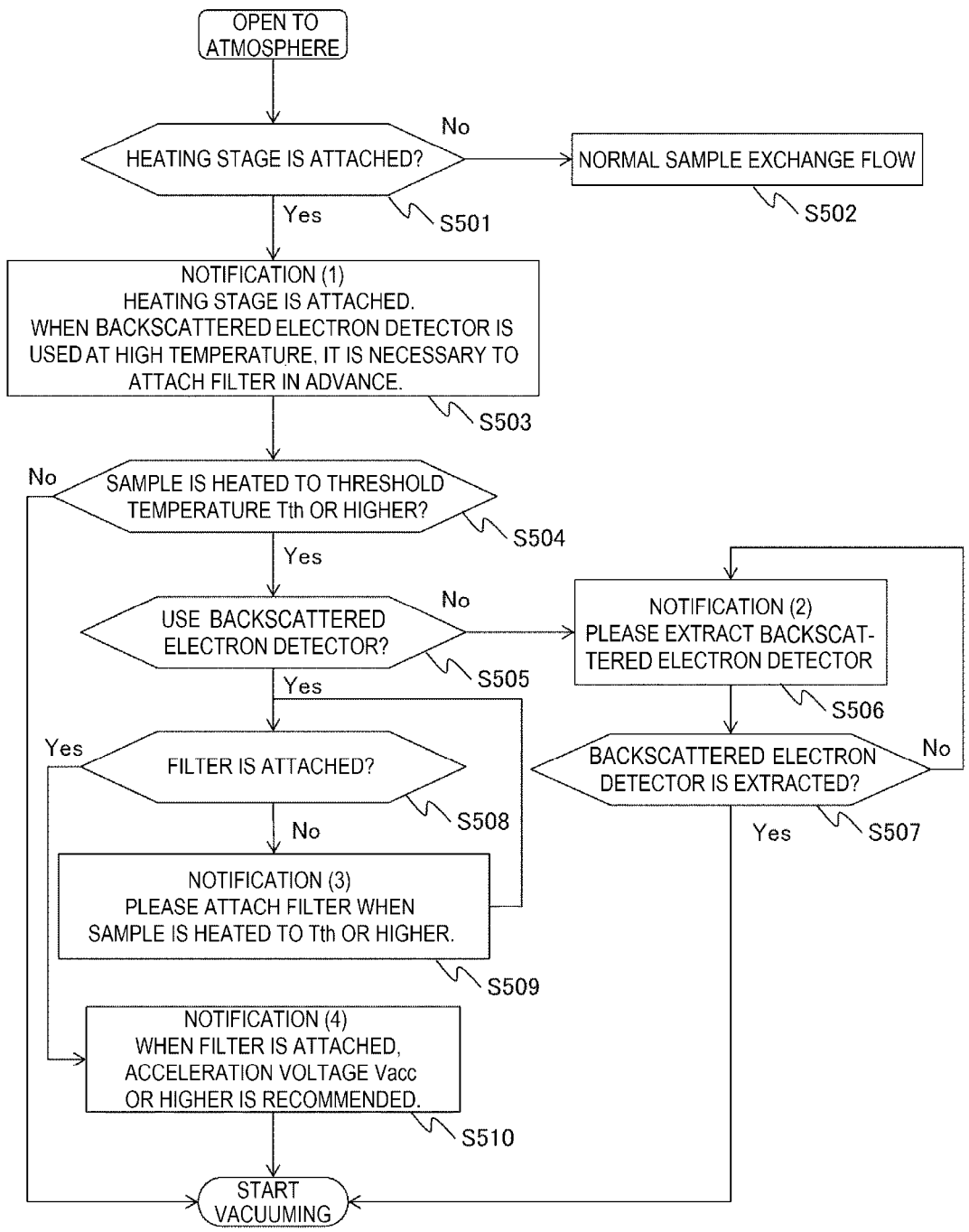

[FIG. 6]
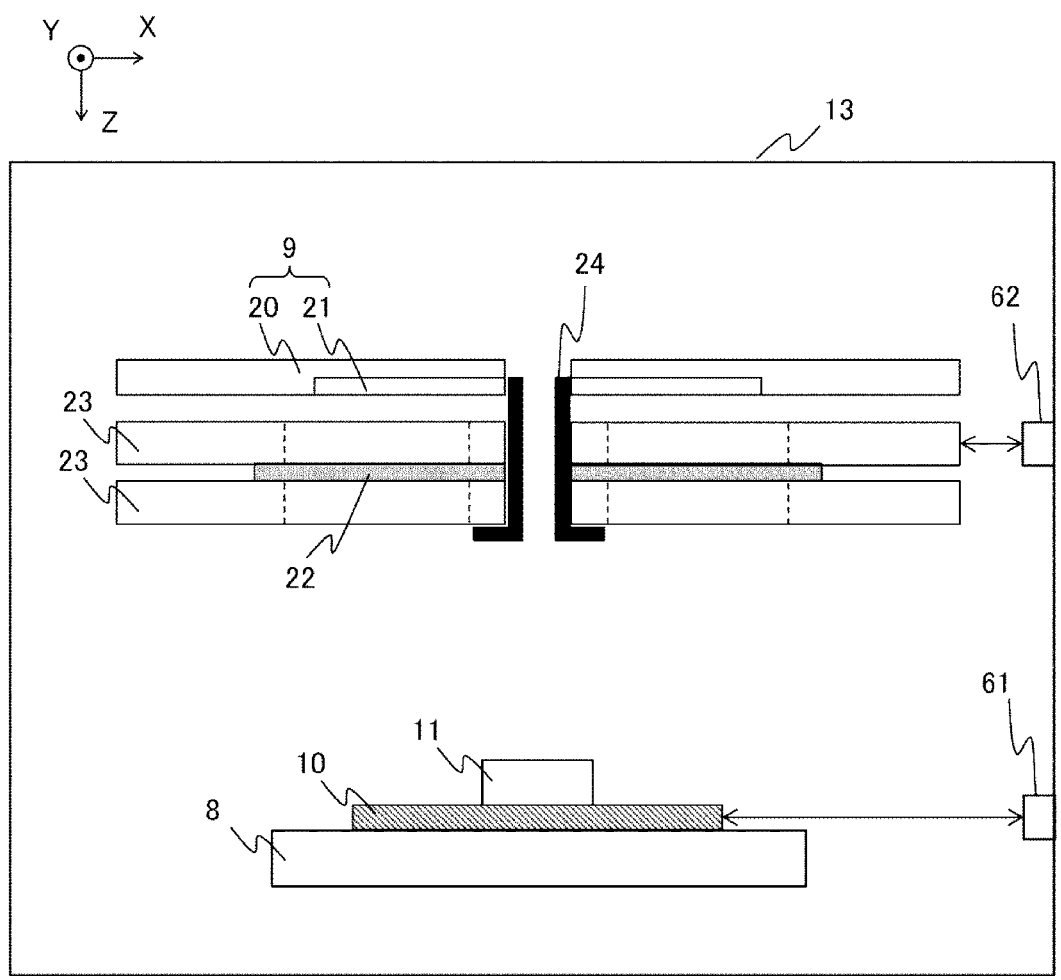

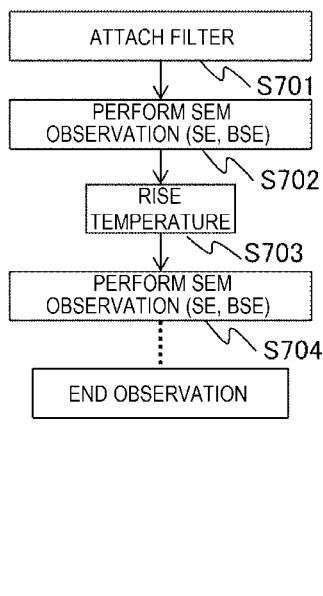 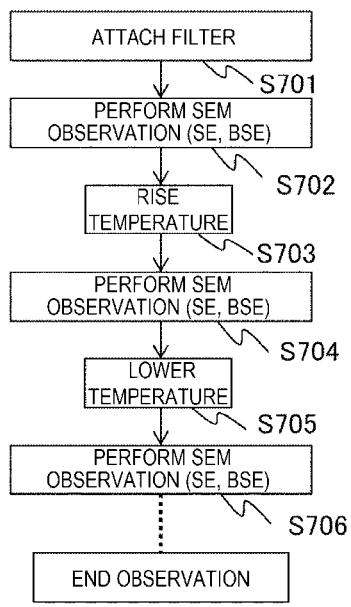 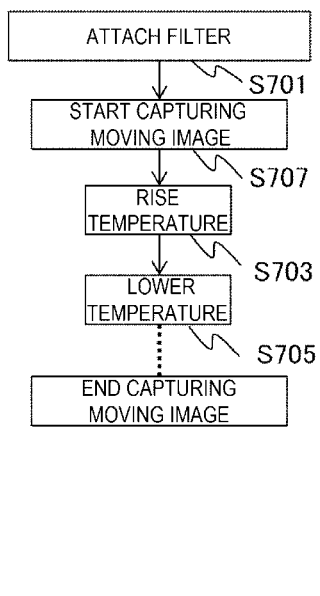
FIG. 7A         FIG. 7B         FIG. 7C
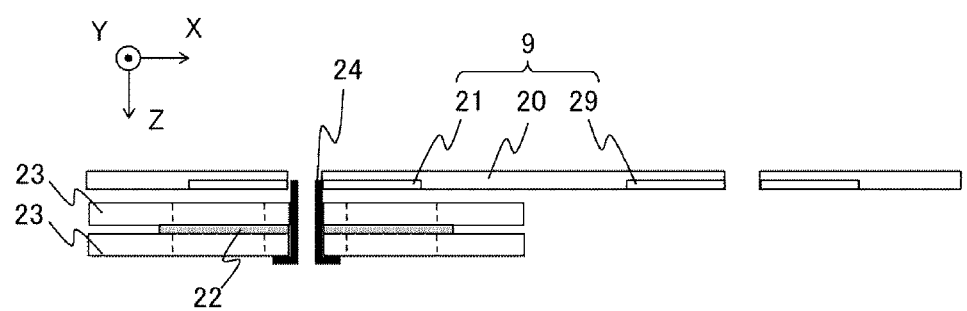
FIG. 8

CHARGED PARTICLE BEAM APPARATUS AND SAMPLE OBSERVATION METHOD

TECHNICAL FIELD

The present invention relates to a charged particle beam apparatus and a sample observation method using the same, and relates to sample observation when light is emitted from a sample.

BACKGROUND ART

Charged particle beam apparatuses represented by scanning electron microscopes are widely used to observe a fine region of a sample. In particular, observation of a backscattered electron image, which is an image obtained by detecting backscattered electrons emitted from a sample, is an effective method for checking an organization structure and a composition distribution of the sample. When only backscattered electrons having energy in a certain range are selected and detected, information on a predetermined depth of the sample, for example, information on a surface of the sample when the backscattered electrons have high energy and information on a deep portion of the sample when the backscattered electrons have low energy can be checked.

PTL 1 discloses that a plastic thin film coated with a conductive material such as aluminum or carbon on both sides thereof is used as a filter member for selecting backscattered electrons having energy in a certain range.

CITATION LIST

Patent Literature

PTL 1: JP-A-S59-197881

SUMMARY OF INVENTION

Technical Problem

However, PTL 1 does not consider an influence of light emitted when an action such as heating is applied to the sample. In sample observation using a charged particle beam apparatus, there is an increasing need for in-situ observation of changes in the organization structure and the composition distribution while the sample is heated. When the backscattered electron image is used for such observation, light emitted from the sample is detected together with the backscattered electrons by applying a predetermined action, which may negatively influence the backscattered electron image.

Therefore, an object of the invention is to provide a charged particle beam apparatus capable of observing a sample even when light is emitted from the sample, and a sample observation method using the charged particle beam apparatus.

Solution to Problem

In order to achieve the above object, the invention provides a charged particle beam apparatus including: a charged particle beam source configured to irradiate a sample with a charged particle beam; a detector configured to detect charged particles emitted from the sample; and a control device configured to generate an image based on an output signal from the detector. The charged particle beam apparatus further includes a filter configured to allow at least apart of the charged particles emitted from the sample to transmit through the filter and configured to shield light emitted from the sample. The filter covers a detection surface of the detector expected from the sample.

The invention further provides a sample observation method for observing a sample using a charged particle beam apparatus including: a charged particle beam source configured to irradiate a sample with a charged particle beam; a detector configured to detect charged particles emitted from the sample; and a control device configured to generate an image based on an output signal from the detector. The sample observation method includes observing the sample by attaching, to the charged particle beam apparatus, a filter that is configured to allow at least a part of the charged particles emitted from the sample to transmit through the filter, that is configured to shield light emitted from the sample, and that covers a detection surface of the detector expected from the sample.

Advantageous Effect

According to the invention, it is possible to provide a charged particle beam apparatus capable of observing a sample even when light is emitted from the sample, and a sample observation method using the charged particle beam apparatus.

BRIEF DESCRIPTION OF DRAWINGS

FIG. 1 is an overall configuration view illustrating a scanning electron microscope which is an example of a charged particle beam apparatus.

FIG. 4 is a view illustrating transmission of backscattered electrons and reflection of light.

FIG. 5 is a diagram illustrating a flow of processing until vacuuming is started.

FIG. 6 is a view illustrating a detection unit that detects attachment of a substage and the filter.

FIGS. 7A-7C are diagrams illustrating flows of processing using a sample observation method.

FIG. 8 is a view illustrating a detector to which the filter is attached and a detector to which the filter is not attached.

DESCRIPTION OF EMBODIMENTS

Figure 2A:
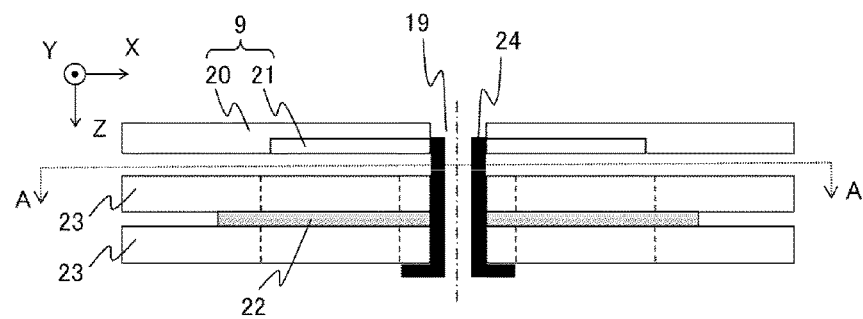
FIGS. 2A-2C are views illustrating a structure of a filter.

Hereinafter, embodiments of a charged particle beam apparatus and a sample observation method using the same according to the invention will be described with reference to the accompanying drawings. The charged particle beam apparatus is an apparatus that observes and processes a sample by irradiating the sample with a charged particle beam, and examples of the charged particle beam apparatus include various apparatuses such as a scanning electron microscope, a scanning ion microscope, and a scanning transmission electron microscope. Hereinafter, the scanning electron microscope will be described as an example of the charged particle beam apparatus.

First Embodiment

An overall configuration of a scanning electron microscope according to the present embodiment will be described with reference to FIG. 1. In FIG. 1, a vertical direction is defined as a Z direction, and horizontal directions are defined as an X direction and a Y direction.

A primary electron beam 2 emitted from an electron gun 1, which is a charged particle beam source, is once focused by a first focusing lens 3 and then spreads, and reaches an objective diaphragm 4. A part of the primary electron beam 2 that reaches the objective diaphragm 4 passes through a hole of the objective diaphragm 4, and the primary electron beam 2 that spreads outside a diameter of the hole is blocked. A current amount of the primary electron beam 2 with which the sample 11 is irradiated is adjusted based on a degree of focusing performed by the first focusing lens 3 and a size of the hole of the objective diaphragm 4.

The primary electron beam 2 passed through the objective diaphragm 4 is focused on an observation surface of the sample 11 placed on a sample stage 8 by a second focusing lens 5 and an objective lens 6. The observation surface of the sample 11 is scanned with the primary electron beam 2 by an action of a deflection coil 7. Backscattered electrons and secondary electrons, which are charged particles generated from the sample 11 by the irradiation with the primary electron beam 2, are detected by a detector 9. The detector 9 outputs a detection signal according to an amount of the detected charged particles.

An electron optical system including the electron gun 1 to the objective lens 6 is disposed in a microscope barrel 12, and the sample stage 8 and the detector 9 are disposed in a sample chamber 13. The electron optical system has a rotating body shape with an optical axis of the primary electron beam 2 serving as a rotation axis. The microscope barrel 12 and the sample chamber 13 are evacuated and connected to each other via an opening 14 through which the primary electron beam 2 passes. Since the electron gun 1 and the objective diaphragm 4 that are disposed in the microscope barrel 12 are used under a high degree of vacuum, it is desirable to reduce an influence of a decrease in a degree of vacuum of the sample chamber 13 on the microscope barrel 12. Here, in order to prevent the decrease in the degree of vacuum in the microscope barrel 12, the opening 14 is functioned as a differential pumping diaphragm.

The portions disposed in the microscope barrel 12 and the sample chamber 13 are controlled by a control device 15. The control device 15 generates an observation image, for example, a backscattered electron image, based on the detection signal output from the detector 9. The control device 15 may be dedicated hardware that performs processing such as control of each portion, or may be a general-purpose processor, for example, a central processing unit (CPU), a graphics processing unit (GPU), or a digital signal processor (DSP). When the control device 15 is the general-purpose processor, software for performing processing such as control is implemented.

An image display device 16, a storage device 17, and an operation panel 18 are connected to the control device 15. The observation image and an operation screen are displayed on the image display device 16. The storage device 17 stores the generated observation images (including still images and moving images), a control program used for processing such as control, and the like. The operation panel 18 is an interface to which an operation instruction of an operator is input, and is a pointing device, for example, a keyboard, a touch panel, or a mouse. The operator inputs the operation instruction to the operation panel 18 while observing an image displayed on the image display device 16, thereby moving the sample stage 8 in the XYZ directions and searching for a desired observation position.

The substage 10 that applies a predetermined action to the sample 11 can be attached to the sample stage 8. The substage 10 heats the sample 11 and applies a force to the sample 11, and is attached to the sample stage 8 at the time of in-situ observation of observing a microscopic change occurring on the sample 11 due to the applied predetermined action. The substage 10 may be controlled by the control device 15, or may be controlled by an external control device, for example, a personal computer (PC) or the like.

Light may be emitted from the sample 11 due to the predetermined action such as heating the sample 11 or applying a force to the sample 11. When the light emitted from the sample 11 is detected by the detector 9, an extra signal is superimposed on the detection signal from the detector 9, and the generated image is negatively influenced. Therefore, in the present embodiment, while the charged particles emitted from the sample 11, for example, the backscattered electrons are detected by the detector 9, the light emitted from the sample 11 is not detected by the detector 9, and the negative influence on the generated image, for example, the backscattered electron image is eliminated. The light emitted from the sample 11 is not limited to visible light, and includes infra-red rays, ultra-violet rays, or the like detected by the detector 9.

Figure 2B:
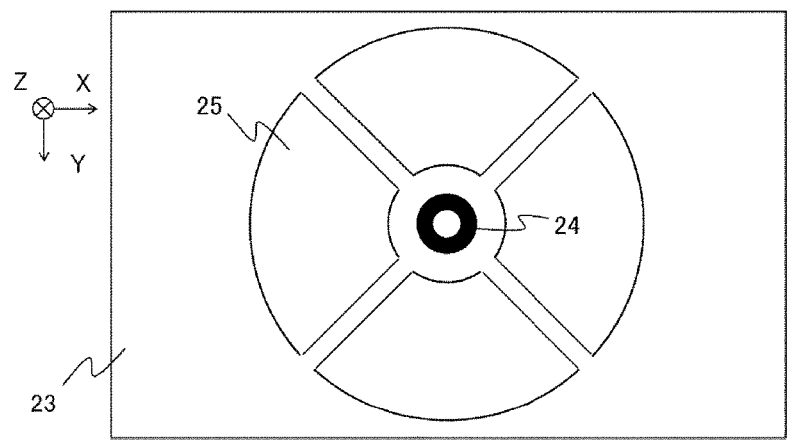
Figure 2C:
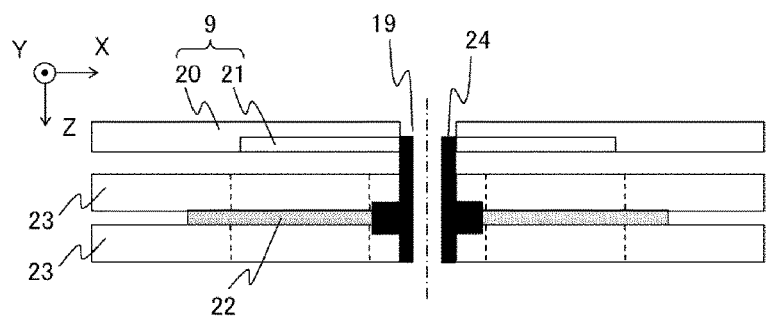

With reference to FIG. 2, a filter which is an essential part according to the present embodiment and shields light will be described together with the detector 9. FIGS. 2(a) and 2(c) are cross-sectional views parallel to the optical axis of the primary electron beam 2, and FIG. 2(b) is a view taken along a line A-A in FIG. 2(a).

The detector 9 includes a detector body 20 and a detection surface 21. The detection surface 21 is, for example, a semiconductor detection element having a circular ring shape, and outputs the detection signal according to an amount of incident charged particles or light. The detector body 20 is a member that holds the detection surface 21, has a circular ring shape concentric with the detection surface 21, and shares a center hole 19 with the detection surface 21. A diameter of the center hole 19, that is, an inner diameter of the detector body 20 and the detection surface 21 is large enough to allow the primary electron beam 2 to pass therethrough. The detector body 20 has an outer diameter larger than that of the detection surface 21, and a surface of the detector body 20 on a sample 11 side is in the same plane as the detection surface 21 and is made of a material through which light or electrons do not transmit. The detection surface 21 may be divided into a plurality of regions.

A filter that shields light is disposed between the detector 9 and the sample 11. The filter includes a film portion 22, a holding portion 23, and a cylinder portion 24.

The film portion 22 reflects or absorbs the light emitted from the sample 11 and transmits the charged particles such as the backscattered electrons emitted from the sample 11, and includes at least a metal film having a thickness of, for example, 0.1 μm to 1 μm. In order to improve mechanical strength of the film portion 22, the film portion 22 may have a stacked-layer structure in which a metal such as Al is deposited on a polymer thin film having a thickness of 1 μm to 100 μm. A hole through which the primary electron beam 2 can pass is formed at a center of the film portion 22.

The holding portion 23 is a member that holds the film portion 22 by sandwiching the film portion 22 from the Z direction without slackening, and is made of a material through which light or electrons do not transmit. In order to prevent the holding portion 23 from being charged, it is desirable that the holding portion 23 is made of a conductive material. The holding portion 23 is formed with an opening portion 25 having a shape as shown in FIG. 2(b), and light and electrons can pass through the opening portion 25. A hole through which the primary electron beam 2 can pass is formed at a center of the holding portion 23.

The cylinder portion 24 is a cylindrical member that is inserted into the holes formed in the film portion 22 and the holding portion 23, and is made of a material through which light or electrons do not transmit. In order to prevent the cylinder portion 24 from being charged, it is desirable that the cylinder portion 24 is made of a conductive material. An inner diameter of the cylinder portion 24 is large enough to allow the primary electron beam 2 to pass therethrough. A length of the cylinder portion 24 in the Z direction is a length that allows the cylinder portion 24 to penetrate the holes formed in the film portion 22 and the holding portion 23 in the Z direction and to be fitted into the center hole 19 of the detector 9. A shape of the cylinder portion 24 in a cross section parallel to the optical axis of the primary electron beam 2 may be an L shape as shown in FIG. 2(a) or a shape having a convex portion at a position of the film portion 22 as shown in FIG. 2 (c).

Figure 3A:
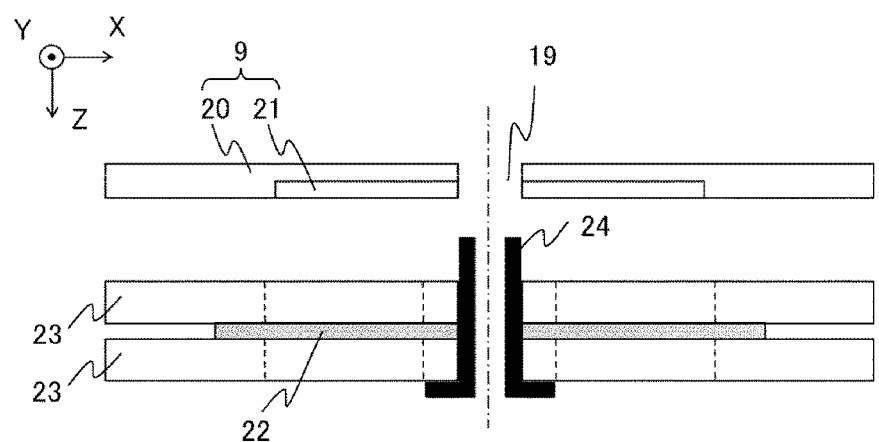
FIGS. 3A-3C are views illustrating attachment and detachment of a detector and the filter, replacement of a film portion, and a configuration example of the film portion.
Figure 3B:
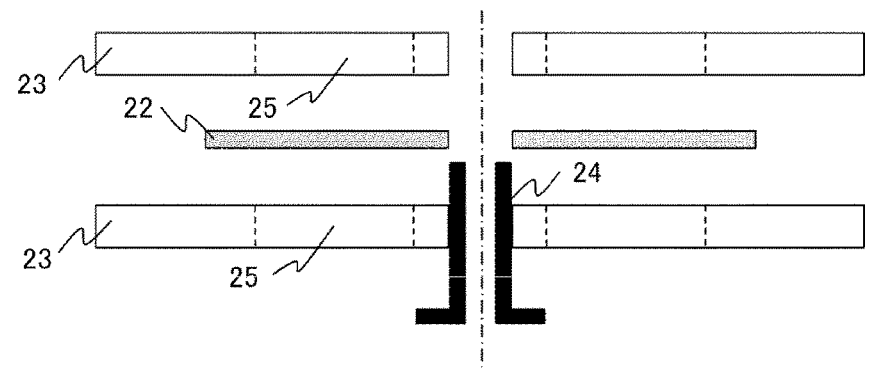

With reference to FIG. 3, an example of attachment and detachment of the detector 9 and the filter, replacement of the film portion 22 of the filter, and a configuration example of the film portion 22 will be described. FIG. 3(a) is a view illustrating a state in which the filter including the film portion 22, the holding portion 23, and the cylinder portion 24 is removed from the detector 9. The filter is attached to the detector 9 by fitting a tip end of the cylinder portion 24 of the filter into the center hole 19 of the detector 9 based on the state in FIG. 3 (a). That is, the detector 9 and the filter have a structure in which the detector 9 and the filter are attachable to and detachable from each other.

FIG. 3 (b) is a view illustrating a state in which the holding portion 23 and the film portion 22 on an electron gun 1 side are removed from the cylinder portion 24 and a position of the holding portion 23 on the sample 11 side is shifted. Since the film portion 22 and the holding portion 23 can be removed from the cylinder portion 24, the portions can be replaced when the film portion 22 is damaged or when the holding portion 23 or the cylinder portion 24 is deteriorated over time.

Figure 3C:
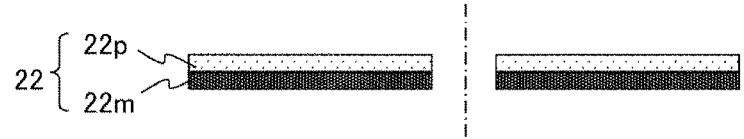

FIG. 3 (c) shows a configuration example of the film portion 22. In the film portion 22 shown in FIG. 3(c), a polymer thin film 22p and a metal thin film 22m are stacked, and the metal thin film 22m is disposed on the sample 11 side. With such a configuration, while the metal thin film 22m reflects or absorbs the light emitted from the sample 11, the mechanical strength of the film portion can be improved by the polymer thin film 22p, and the backscattered electrons can be transmitted. In PTL 1, both surfaces of a plastic thin film are coated with a conductive material, whereas in the film portion 22 shown in FIG. 3(c), only the polymer thin film 22p on the sample 11 side is coated with the metal thin film 22m, so that the backscattered electrons can be further transmitted.

Transmission of a backscattered electron 27 emitted from the sample 11 and reflection of light 28 emitted from the sample 11 will be described with reference to FIG. 4. The sample stage 8 and the detector 9 are disposed in the sample chamber 13. The substage 10 that applies the predetermined action to the sample 11 is attached on the sample stage 8, and the filter including the film portion 22, the holding portion 23, and the cylinder portion 24 is disposed between the sample 11 and the detector 9. The filter covers the detection surface 21 of the detector 9 expected from the sample 11. More specifically, the detection surface 21 parallel to the observation surface of the sample 11, which is a surface irradiated with the primary electron beam 2, is covered with the film portion 22 of the filter, and an inner peripheral surface, which is the detection surface 21 orthogonal to the observation surface, is covered with the cylinder portion 24.

When the sample 11 is irradiated with the primary electron beam 2 while the predetermined action is applied to the sample by the substage 10, the charged particles such as the backscattered electron 27 are emitted from the sample 11 and the light 28 is emitted. The backscattered electron 27 passes through the opening portion 25 of the holding portion 23 and passes through the film portion 22 to reach the detection surface 21, whereas the light 28 passes through the opening portion 25 of the holding portion 23, but is reflected by the film portion 22 and cannot reach the detection surface 21. That is, the present embodiment can provide a charged particle beam apparatus capable of observing a backscattered electron image without being negatively influenced by the light 28, since even when the light 28 is emitted from the sample 11, the backscattered electron 27 reaches the detection surface 21 of the detector 9 without the light 28 reaching the detection surface 21.

The opening portion 25 of the holding portion 23 preferably has an outer diameter smaller than that of the film portion 22 and larger than that of the detection surface 21 of the detector 9. Since the opening portion 25 has the outer diameter smaller than that of the film portion 22, the light emitted from the sample 11 can be prevented from being detected by the detector 9. Since the opening portion 25 has the outer diameter larger than that of the detection surface 21, the backscattered electrons emitted from the sample 11 are easily detected by the detector 9.

With reference to FIG. 5, an example of a flow of processing until vacuuming of the sample chamber 13 is started according to the present embodiment will be described. When the detector 9 is covered with the filter, detection efficiency of the backscattered electrons decreases. Therefore, when the substage 10 is not attached, it is better to remove the filter from the detector 9. However, in a case in which the filter is not attached when the predetermined action is applied to the sample 11 by the substage 10, a defect occurs in the image due to the light emitted from the sample 11, and the sample cannot be observed. Therefore, in FIG. 5, a message corresponding to an attachment state of the substage 10 or the filter is notified to the operator, so that when the light is emitted from the sample 11, the filter is prevented from being unattached. Hereinafter, a case will be described in which the substage 10 is a heating stage that heats the sample 11.

(S501)

The control device 15 determines whether the heating stage is attached. When the heating stage is not attached, the processing proceeds to S502, and when the heating stage is attached, the processing proceeds to S503.

For the determination in this step, a substage detection unit 61 as shown in FIG. 6 is used. The substage detection unit 61 is, for example, a laser displacement meter, and determines attachment of the substage based on a distance from the substage detection unit 61. The substage detection unit 61 is not limited to the laser displacement meter, and may be a camera that projects a periphery of the sample stage 8 or a contact sensor attached to the sample stage 8.

(S502)

The control device 15 advances the processing as a normal sample exchange flow. That is, after the sample 11 is mounted on the sample stage 8, the vacuuming is started without the filter being attached to the detector 9.

(S503)

The control device 15 displays, for example, a message "The heating stage is attached. When a backscattered electron detector is used at a high temperature, it is necessary to attach the filter in advance." on the image display device 16, and notifies the operator of the message.

(S504)

The control device 15 determines whether the sample 11 is heated to a temperature equal to or higher than a threshold temperature Tth. When an observation temperature set by the operator via the operation panel 18 is equal to or higher than Tth, the processing proceeds to S505, and when the observation temperature is lower than Tth, the vacuuming is started. The threshold temperature Tth is a value for determining whether the temperature is high, is, for example, 300° C., is stored in the storage device 17 in advance, and is read by the control device 15.

(S505)

The control device 15 determines whether the backscattered electron detector, which is a detector that detects the backscattered electrons, is used. Under imaging conditions set by the operator via the operation panel 18, when the backscattered electron detector is not used, the processing proceeds to S506, and when the backscattered electron detector is used, the processing proceeds to S508.

(S506)

The control device 15 displays, for example, a message "Please extract the backscattered electron detector." on the image display device 16, and notifies the operator of the message.

(S507)

The control device 15 determines whether the backscattered electron detector is extracted. When the backscattered electron detector is not extracted, the processing returns to S506, and when the backscattered electron detector is extracted, the vacuuming is started.

(S508)

The control device 15 determines whether the filter is attached. When the filter is not attached to the detector 9, the processing proceeds to S509, and when the filter is attached to the detector 9, the processing proceeds to S510.

For the determination in this step, a filter detection unit 62 as shown in FIG. 6 is used. The filter detection unit 62 is, for example, a laser displacement meter, and determines attachment of the filter based on a distance from the filter detection unit 62. The filter detection unit 62 is not limited to the laser displacement meter, and may be a camera that projects a periphery of the detector 9 or a contact sensor attached to the detector 9.

(S509)

The control device 15 displays, for example, a message "Please attach the filter when the sample is heated to Tth or higher." on the image display device 16, and notifies the operator of the message. A value read in S504 is used as a value of Tth.

After this step, the processing returns to S508. Therefore, when the filter is not attached to the detector 9, S508 and S509 are repeated. That is, the processing does not proceed to other steps until the attachment of the filter is checked or detected.

(S510)

The control device 15 displays, for example, a message "When the filter is attached, an acceleration voltage Vacc or higher is recommended." on the image display device 16, and notifies the operator of the message. A value of Vacc is, for example, 10 kV, is stored in the storage device 17 in advance, and is read by the control device 15 before the message is displayed in this step.

According to the flow of the processing described above, when the substage 10 is attached and the light is emitted from the sample 11, a message prompting the attachment of the filter is notified to the operator, and the filter can be prevented from being unattached.

Several examples of the sample observation method using the charged particle beam apparatus according to the present embodiment will be described with reference to FIG. 7. FIG. 7(*a*) shows a case in which an observation and a temperature rise of the sample 11 are repeated, FIG. 7(*b*) shows a case in which the observation, the temperature rise, the observation, and a temperature fall of the sample 11 are repeated, and FIG. 7 (*c*) shows a case in which processes of the temperature rise and the temperature fall of the sample 11 is acquired by a moving image. Hereinafter, each step will be described.

(S701)

The filter including the film portion 22, the holding portion 23, and the cylinder portion 24 is attached to a scanning electron microscope which is an example of the charged particle beam apparatus. The substage 10 is attached to the sample stage 8 so as to apply the predetermined action to the sample 11. After the filter is attached, the vacuuming is started in the sample chamber 13.

(S702)

After an inside of the sample chamber 13 reaches a predetermined degree of vacuum, SEM observation is performed before the predetermined action is applied to the sample 11, for example, in a state before heating. In this step, a secondary electron image, the backscattered electron image, or both of the secondary electron image and the backscattered electron image, which are images obtained by detecting the secondary electrons emitted from the sample 11, are acquired. The secondary electron image is used for a purpose of observing a surface shape of the sample 11, and the backscattered electron image is used for a purpose of observing an organization structure and a composition distribution of the sample 11. In a case in which a change cannot be predicted as in the case in which the predetermined action is applied to the sample 11, both the secondary electron image and the backscattered electron image are acquired.

(S703)

The sample 11 is heated to a predetermined temperature by the substage 10.

(S704)

After the temperature of the sample 11 reaches the predetermined temperature, the SEM observation is performed. A region to be observed is preferably the same as a region observed in S702.

In FIG. 7(*a*), S703 and S704 are repeated as necessary.

(S705)

The temperature of the sample 11 is lowered to the predetermined temperature by the substage 10.

(S706)

After the temperature of the sample 11 reaches the predetermined temperature, the SEM observation is performed. A region to be observed is preferably the same as the region observed in S702 or S704.

In FIG. 7 (*b*), the processing from S703 to S706 is repeated as necessary.

(S707)

The control device 15 starts capturing the moving image.

In FIG. 7(*c*), after the processing in S703 and S705 are repeated as necessary, the control device 15 ends the capturing of the moving image.

According to the flow of the processing described above, it is possible to observe the sample when the predetermined action, for example, the temperature rise and the temperature fall performed on the sample 11, is applied to the sample 11.

When the SEM observation is performed without the filter being attached to the detector 9 in S702, the detector 9 having a configuration as shown in FIG. 8 may be used. The detector 9 shown in FIG. 8 includes the detection surface 21 covered with the filter, and a detection surface 29 not covered with the filter. By using the detector 9 in FIG. 8, it is possible to easily switch to the detection surface 29 without the filter in the SEM observation before the heating as in S702, and to the detection surface 21 with the filter in the SEM observation during the heating as in S704. The detector 9 in FIG. 8 is also useful when the filter is frequently attached or detached.

The charged particle beam apparatus and the sample observation method according to the invention are not limited to the above embodiment, and constituent elements may be modified and embodied without departing from the spirit of the invention. A plurality of constituent elements disclosed in the above embodiment may be appropriately combined. Furthermore, some constituent elements may be removed from all the constituent elements shown in the above embodiments.

REFERENCE SIGN LIST

1: electron gun, 2: primary electron beam, 3: first focusing lens, 4: objective diaphragm, 5: second focusing lens, 6: objective lens, 7: deflection coil, 8: sample stage, 9: detector, 10: substage, 11: sample, 12: microscope barrel, 13: sample chamber, 14: opening, 15: control device, 16: image display device, 17: storage device, 18: operation panel, 19: center hole, 20: detector body, 21: detection surface, 22: film portion, 22*m*: metal thin film, 22*p*: polymer thin film, 23: holding portion, 24: cylinder portion, 25: opening portion, 27: backscattered electron, 28: light, 29: detection surface, 61: substage detection unit, 62: filter detection unit

The invention claimed is:

1. A charged particle beam apparatus comprising:
a charged particle beam source configured to irradiate a sample with a charged particle beam;
a detector configured to detect charged particles emitted from the sample; and
a control device configured to generate an image based on an output signal from the detector, wherein
the charged particle beam apparatus further comprises a filter configured to allow at least a part of the charged particles emitted from the sample to transmit through the filter and configured to shield light emitted from the sample, and
the filter covers a detection surface of the detector expected from the sample.

2. The charged particle beam apparatus according to claim 1, wherein
the filter includes a film portion covering a detection surface parallel to an observation surface of the sample, and a cylinder portion covering a detection surface orthogonal to the observation surface.

3. The charged particle beam apparatus according to claim 2, wherein
the film portion is replaceable, and is sandwiched and held by a plurality of holding portions each formed with an opening portion.

4. The charged particle beam apparatus according to claim 3, wherein
the opening portion is smaller than the film portion and larger than the detection surface parallel to the observation surface.

5. The charged particle beam apparatus according to claim 2, wherein
the filter and the detector are attachable to and detachable from each other, and the cylinder portion of the filter is fitted into a center hole that is a hole formed at a center of the detector.

6. The charged particle beam apparatus according to claim 2, wherein
the film portion is formed by stacking a polymer thin layer and a metal thin film, and the metal thin film is disposed on a sample side.

7. A sample observation method for observing a sample using a charged particle beam apparatus including: a charged particle beam source configured to irradiate a sample with a charged particle beam; a detector configured to detect charged particles emitted from the sample; and a control device configured to generate an image based on an output signal from the detector, the sample observation method comprising:
observing the sample by attaching, to the charged particle beam apparatus, a filter that is configured to allow at least a part of the charged particles emitted from the sample to transmit through the filter, that is configured to shield light emitted from the sample, and that covers a detection surface of the detector expected from the sample.

8. The sample observation method according to claim 7, wherein
when attachment of a substage that applies an action of causing light to emit from the sample to the sample is detected, a notification prompting attachment of the filter is issued.

9. The sample observation method according to claim 7, wherein
a notification prompting attachment of the filter is repeated until the attachment of the filter is detected.

* * * * *